US 6,643,099 B1

(12) United States Patent
Bonin et al.

(10) Patent No.: US 6,643,099 B1
(45) Date of Patent: Nov. 4, 2003

(54) TRANSDUCER FORMED ON A SACRIFICIAL METAL SUBSTRATE

(75) Inventors: Wayne A. Bonin, North Oaks, MN (US); Zine-Eddine Boutaghou, Vadnais Heights, MN (US); Roger L. Hipwell, Jr., Eden Prairie, MN (US); Barry D. Wissman, Eden Prairie, MN (US); Lee Walter, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 271 days.

(21) Appl. No.: 09/728,778

(22) Filed: Dec. 1, 2000

Related U.S. Application Data

(60) Provisional application No. 60/213,089, filed on Jun. 20, 2000.

(51) Int. Cl.[7] ................................................. G11B 5/60
(52) U.S. Cl. ............................... 360/234.5; 360/245.8
(58) Field of Search ........................... 360/245.8, 245.9, 360/234.5, 234.7, 234.4

(56) References Cited

U.S. PATENT DOCUMENTS

| | | | | |
|---|---|---|---|---|
| 4,809,103 A | * | 2/1989 | Lazzari | 360/234.5 |
| 5,680,275 A | * | 10/1997 | Frater et al. | 360/234.5 |
| 5,736,456 A | * | 4/1998 | Akram | 438/614 |
| 5,844,753 A | | 12/1998 | Inaba | 360/264.2 |
| 5,889,636 A | * | 3/1999 | Arya et al. | 360/234.5 |
| 5,906,312 A | | 5/1999 | Zakel et al. | 228/246 |
| 6,021,022 A | | 2/2000 | Himes et al. | 360/245.7 |
| 6,105,852 A | * | 8/2000 | Cordes et al. | 228/254 |
| 6,256,170 B1 | * | 7/2001 | Honda | 360/234.5 |
| 6,330,132 B1 | * | 12/2001 | Honda | 360/234.5 |
| 6,351,353 B1 | * | 2/2002 | Sluzewski et al. | 360/294.3 |
| 6,427,901 B2 | * | 8/2002 | Dautartas | 228/180.22 |

OTHER PUBLICATIONS

"Microstructure Fabrication" in Van Nostrand's Scientific Encylopedia, Sixth Edition, 1983, pp. 1877–1881.

* cited by examiner

*Primary Examiner*—Brian E. Miller
(74) *Attorney, Agent, or Firm*—Westman, Champlin & Kelly

(57) ABSTRACT

A transducer assembly in which an electric current is passed through plating solution in recesses of a metal substrate to plate electrical contact bumps having bump fronts in the recesses and exposed bump backs. The transducer is partially formed on the substrate, sealing the exposed bump backs. One or more vacuum processes are performed to complete formation of the transducer. At least a portion of the metal substrate is etched away to expose the bump fronts of the electrical contact bumps.

16 Claims, 5 Drawing Sheets

TRANSDUCER FORMED ON A SACRIFICIAL METAL SUBSTRATE

CROSS REFERENCE TO RELATED APPLICATION

This application claims priority benefits from U.S. Provision Application No. 60/213,089 titled "Contact Bump Process Utilizing A Sacrificial Metal Substrate," filed Jun. 20, 2000 and identified as.

FIELD OF THE INVENTION

The invention relates to contact bumps on microstructure fabricated (MF) transducers. In particular, the invention relates to reducing chemical contamination from contact bumps in MF transducers used in disc drives.

BACKGROUND OF THE INVENTION

In microstructure fabricated (MF) transducer assemblies, such as those used in disc drives, soldering is used to make electrical connections between the MF transducer and external wires or cables. Contact bumps are formed on the MF transducer assembly and soldered to contact pads on a flexible printed circuit. Soldering is a preferred connection method because it provides reliable electrical connections that are small in size and that can be conveniently completed using reflow solder.

Contact bumps are formed of tin, or copper that is plated with tin or solder to enhance solderability. Tin or solder, however, can diffuse during MF vacuum manufacturing processes such as vapor deposition, doping, sputtering and the like. The diffusion of the tin or solder can contaminate processing equipment such as vacuum chambers during the manufacturing processes. Contact bumps are thus added in a separate process step after the vacuum processes have been completed to avoid damage from chemical contamination.

Applying the contact bumps requires moving the transducer assemblies from a contamination-free MF manufacturing environment to an area where the contamination is tolerable. The high levels of precision alignment and automated batch fabrication that are available in MF processes are not available to apply the contact bumps. The contact bump operation is done with less precision and is considerably more costly because it is done in an extra step after the MF vacuum manufacturing processes.

A MF transducer assembly, and a method of manufacturing a MF transducer assembly are needed in which contact bumps can be present within the MF manufacturing environment without contaminating MF vacuum processes.

SUMMARY OF THE INVENTION

A method of manufacturing a transducer assembly is disclosed in which an electric current is passed through plating solution in recesses of a metal substrate to plate contact bumps. The contact bumps have bump fronts in the recesses and have bump backs that are exposed. The bump fronts are covered with a sealing layer that blocks diffusion during MF vacuum processes. A transducer is partially formed on the substrate, sealing the exposed bump backs. One or more vacuum processes are performed to complete formation of the transducer. At least a portion of the metal substrate is etched away to expose the bump fronts of the electrical contact bumps.

DETAILED DESCRIPTION OF THE ILLUSTRATED EMBODIMENTS

Figure 1:
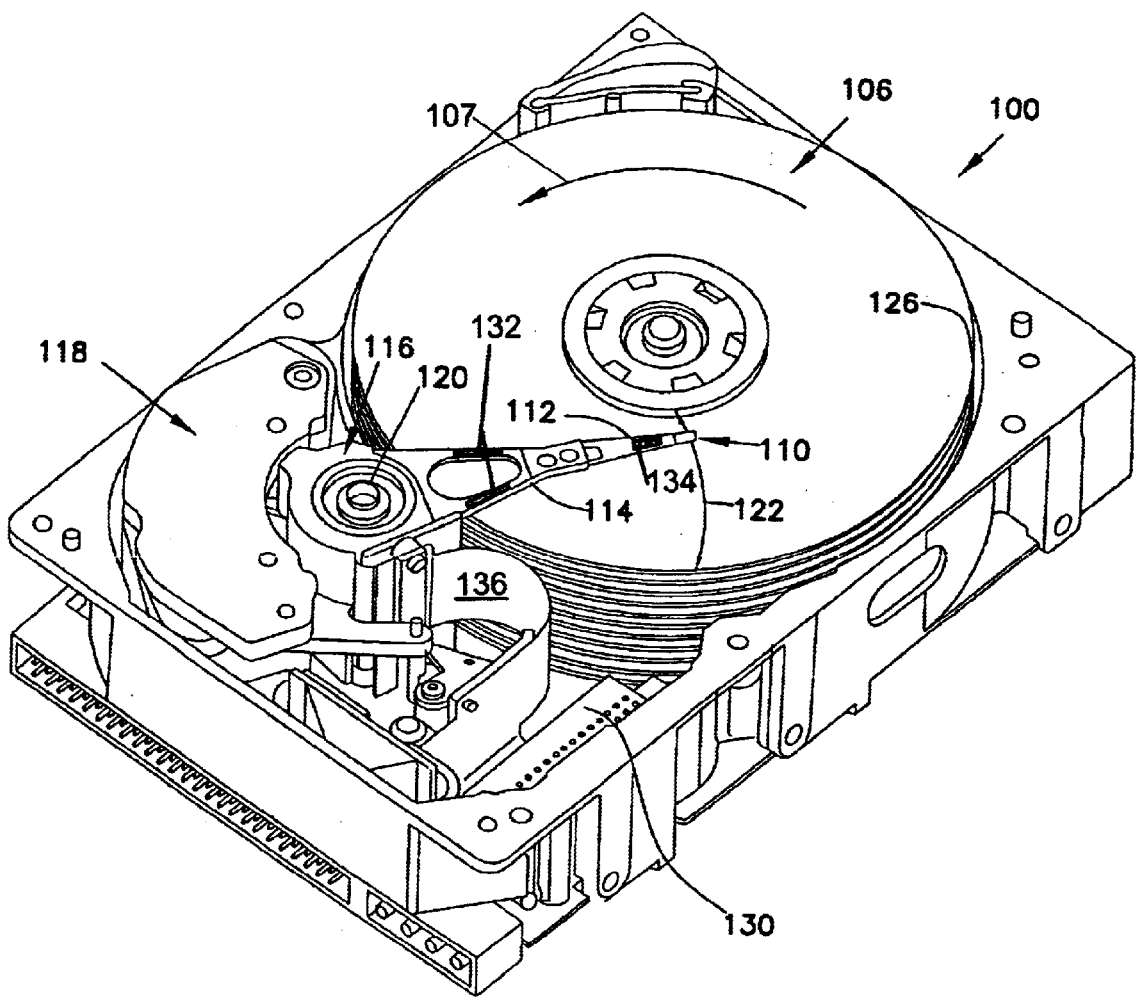
FIG. 1 illustrates an embodiment of a disc drive.

In FIG. 1, an embodiment of a disc drive 100 is illustrated. Disc drive 100 includes a disc pack 126 having storage surfaces 106 which are typically layers of magnetic material. The disc pack 126 includes a stack of multiple discs and the read/write head assembly includes a read/write transducer 110 for each stacked disc. Disc pack 126 is spun or rotated as shown by arrow 107 to allow read/write head assembly 112 to access different rotational locations for data on the storage surfaces 106 on the disc pack 126.

Read/write head assembly 112 is actuated to move radially, relative to the disc pack 126, as shown by arrow 122 to access different radial locations for data on the storage surfaces 106 of disc pack 126. Typically, the actuation of read/write head assembly 112 is provided by a voice coil motor 118. Voice coil motor 118 includes a rotor 116 that pivots on axle 120 and an arm 114 that actuates the read/write head assembly 112. Disc drive 100 includes electronic circuitry 130 for controlling the operation of the disc drive and transferring data in and out of the disc drive.

Disc drive 100 may include various transducers, such as a read/write transducer 110, a microactuator 132 in arm 114 that operates in conjunction with the voice coil motor 118, and an accelerometer 134 mounted on read/write head assembly 112 which provides feedback to circuitry 130 for improved positioning of read/write head 110. Each of these transducers is preferably fabricated as a MF transducer and connected via contact bumps (not illustrated in FIG. 1) and a flexible cable 136 to circuitry 130. As explained in more detail below in connection with FIGS. 2–6, the contact bumps on these MF transducers are formed in a special way in recesses of a metal substrate, allowing these contact bumps to be present on the MF transducer during MF vacuum manufacturing processes without contaminating the MF processing equipment.

The term microstructure fabrication (MF) as used in this application means fabrication of structures by forming patterned layers on substrates using processing techniques common to or adapted from the manufacture of integrated circuits such as patterned masking, selective etching, vacuum deposition, sputtering, doping, implantation or the like. Read/write heads, accelerometers and actuators can be formed in whole or in part by use of microstructure fabrication. Microstructure fabrication includes micromechanical-systems (MEMS) fabrication techniques. Microstructure fabrication is discussed in general terms, for example, under the heading "Microstructure Fabrication" in Van Nostrand's Scientific Encyclopedia, Sixth Edition, 1983, at pages 1877–1881.

Figure 2A:
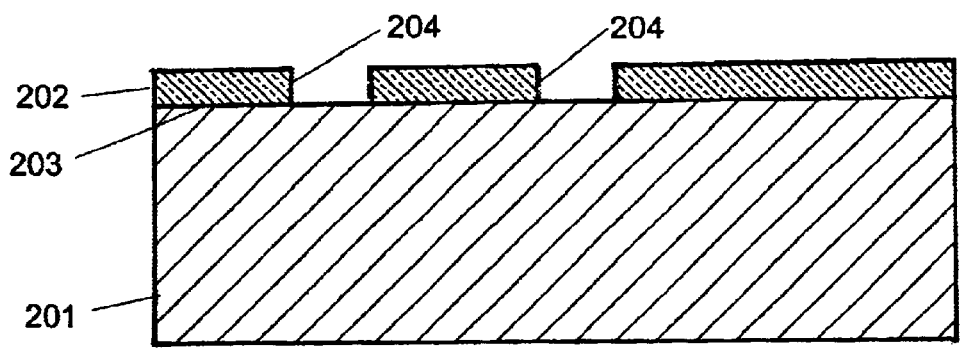
FIGS. 2A, 2B, 2C illustrate process steps in forming contact bumps in a metal substrate.
Figure 2B:
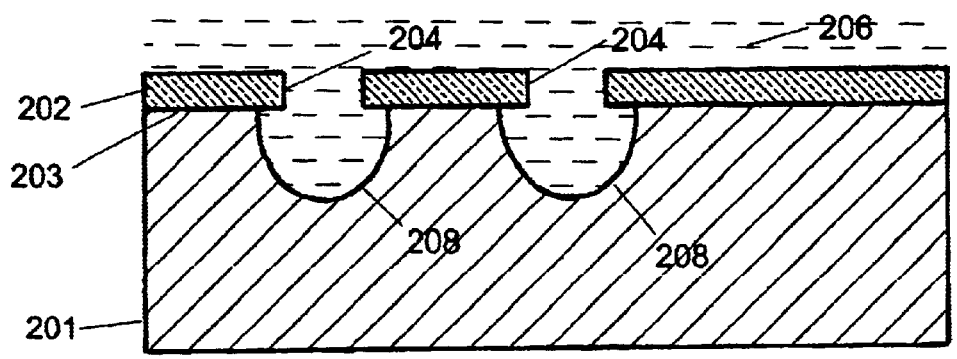
Figure 2C:
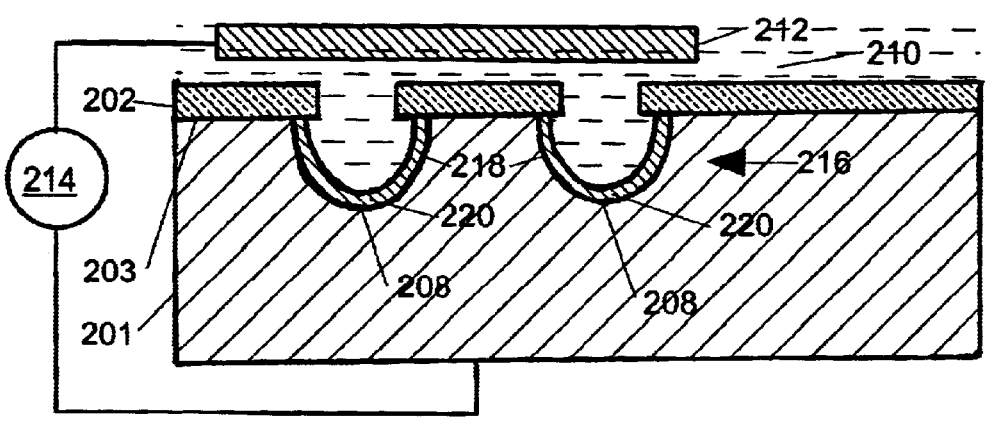

FIGS. 2A, 2B, 2C illustrates process steps in forming electrical contact bumps in a metal substrate 201. At FIG. 2A, a masking layer 202 is applied on a surface 203 of metal substrate 201. Masking layer 202 is applied by well-known MF photolithographic or screening techniques and includes apertures 204 over locations on surface 203 where electrical contacts are desired. After the masking in FIG. 2A, an etching step is performed as illustrated at FIG. 2B. A chemical etchant 206 is applied through the apertures 204 to portions of surface 203 where electrical contacts are desired. Etchant 206 chemically etches the metal substrate 201 to selectively form cavities or recesses 208 with rounded shapes.

The rounded shapes of recesses 208 define a protruding, rounded contact bump shape that is desirable for later reflow soldering or for later contacting an electrically conductive adhesive. Recesses 208 serve as molds that define the shapes of contact bumps 216.

The chemical etchant 206 can be mechanically agitated to speed up etching. If desired, an electric current can also be passed through the etchant 206 and the metal substrate 201 to improve etching. A non-directional etching process is preferred to provide a smooth rounded bump front 218, however, directional etching processes may be used at least initially to achieve a desires shape for bump fronts 218 in some applications.

In a preferred arrangement that is particularly useful in MF magnetic transducers, the metal substrate 201 comprises a cobalt iron alloy and the etchant 206 comprises ferric chloride solution. The preferred composition of the cobalt iron alloy in metal substrate 201 is selected to have magnetic properties for the desired transducer application, and the etching solution 206 is selected for its chemical etching properties with respect to metal substrate 201 and compatibility with the composition of the masking material 202. Commercially available masking materials and etchants can be used. In the case of a magnetic transducer, the metal substrate 201 can also serve as a magnetic keeper. The magnetic keeper constrains the path of magnetic flux in transducers.

As illustrated in FIG. 2C, a plating solution 210 is brought in contact with the rounded recesses 208 and also in contact with an electrode 212. A source of electrical potential or voltage 214 is connected between the metal substrate 201 and the electrode 212. The recesses 208 share a common electrical connection via the metal substrate 208 and it is thus unnecessary to make individual electrical connections to each recess 208 for plating. Current flows through the plating solution and the recesses 208, and the recesses 208 are plated with metal ions from the plating solution 210, forming a sealing layer 220 of electrical contact bumps 216. The plating solution 210 is replenished with metal ions from the electrode 212, which is partially consumed in the plating process.

Sealing layer 220 serves as a diffusion barrier to seal interior copper or tin layers (not present yet at FIG. 2C) so they do not cause undue contamination during later MF vacuum processing steps. Sealing layer 220 can also serve as an etch stop layer during a later etching step when a portion of the substrate 201 is etched away to expose the contact bumps 216. Sealing layer 220 is preferably formed of gold. The sealing layer 220 is preferably extremely thin, on the order of about ten microinches thick, so that it can be conveniently dissolved into a melted solder joint during a later soldering step without excessively contaminating the solder joint.

Figures 3A, 3B:
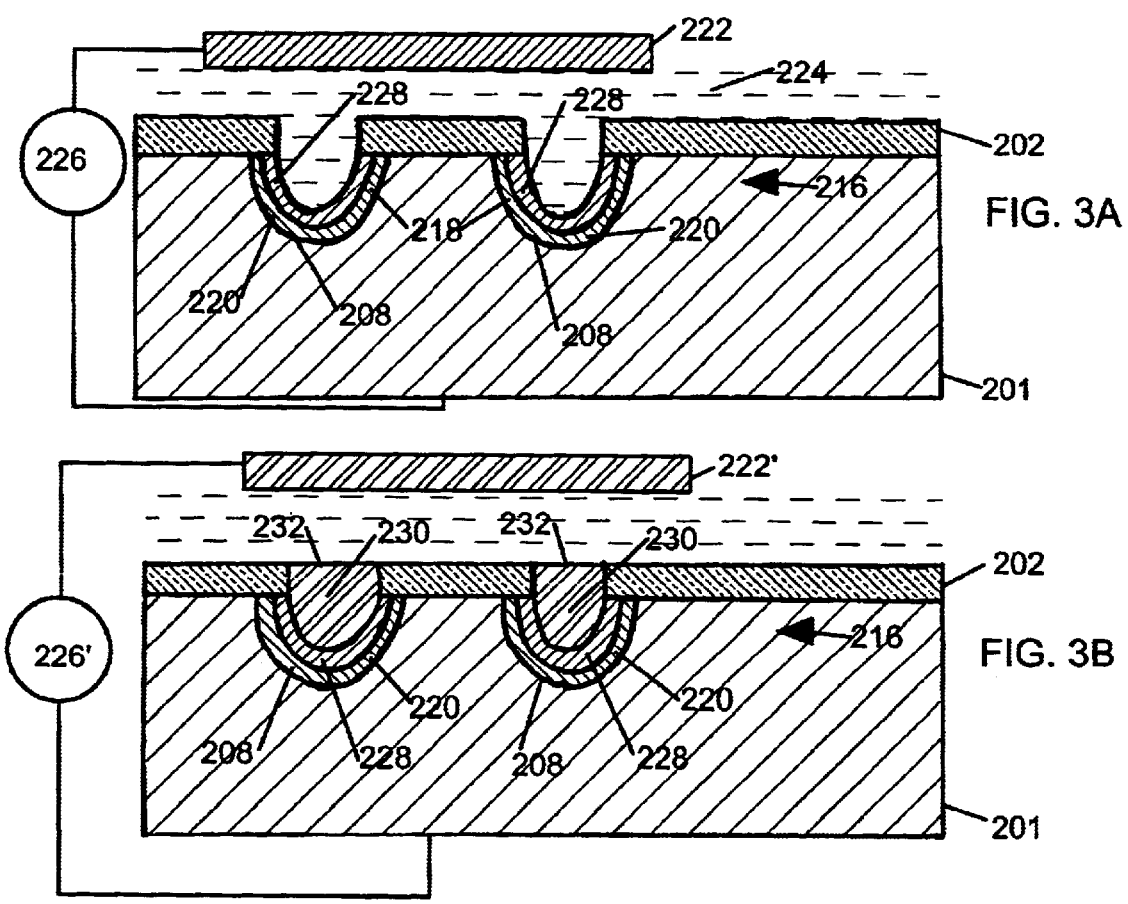
FIGS. 3A, 3B illustrate process steps in forming multiple layer contact bumps in a metal substrate.

FIG. 3 illustrates further process steps in FIG. 3A and FIG. 3B in forming multiple layer contact bumps 216 in a metal substrate 201. The steps illustrated in FIGS. 3A, 3B can be performed after the steps illustrated in FIGS. 2A, 2B, 2C to provide multiple layers in the contact bumps 216. In FIG. 3A, a nickel plating electrode 222, a nickel electroplating solution 224, and a voltage source 226 are provided to plate a nickel layer 228 over the sealing layer 220. Nickel layer 228 is optional and has the advantage that it serves as a barrier between the sealing layer 220 and any subsequently deposited copper layer to help block undesired diffusion between the copper and the sealing layer 220.

As illustrated at FIG. 3B, contact bump 216 is further processed to electroplate a bump back layer 230 that completely fills the remainder of recesses 208 in metal substrate 201. Layer 230 is formed of a soft solderable metal such as copper or tin. Layer 230 has a higher melting temperature than solder and retains the shape of contact bump 216 during later soldering operations.

Upon completion of the process steps in FIGS. 3A, 3B, layers 230 of the contact bumps 216 have upper sides or bump backs 232 that are exposed.

Figure 4A:
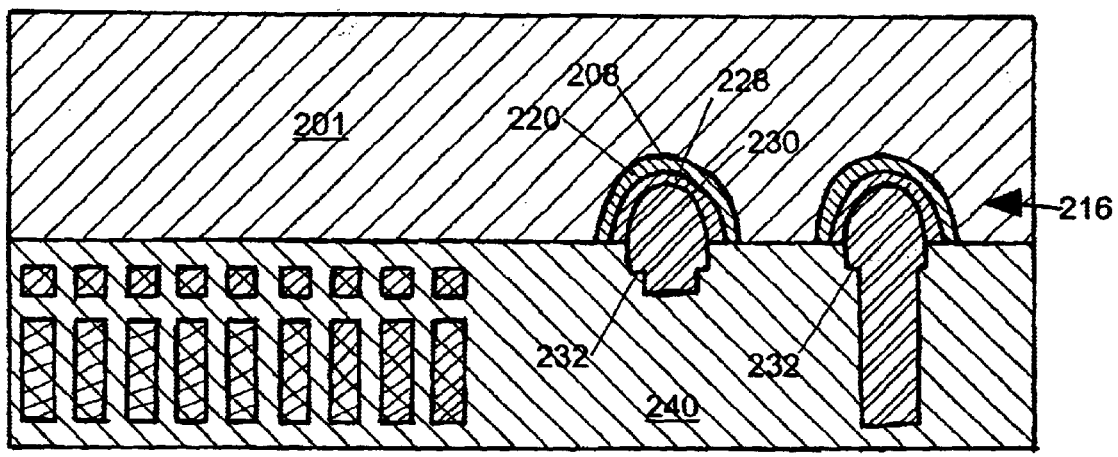
FIGS. 4A, 4B illustrate process steps in forming a transducer and removing a portion of a metal substrate.
Figure 4B:
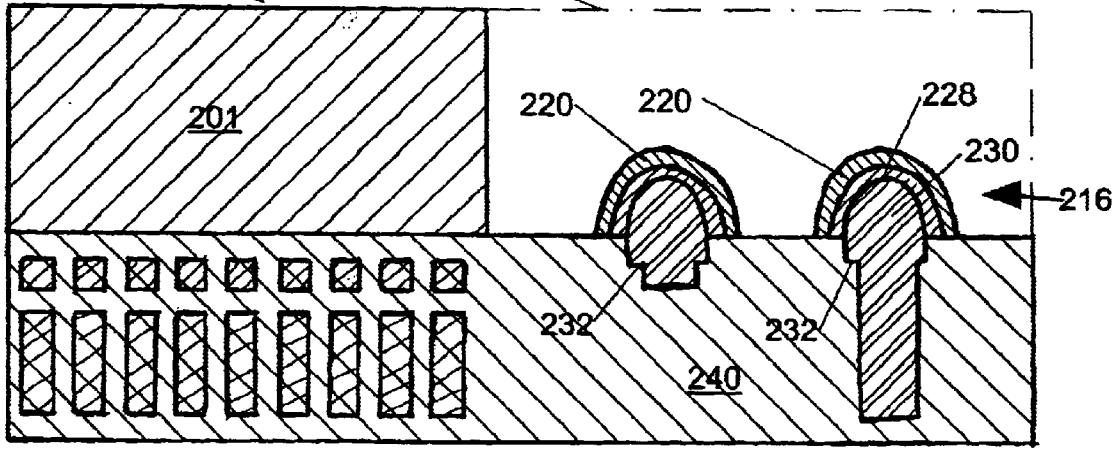

FIGS. 4A, 4B illustrates process steps of forming a transducer assembly 238 and removing a portion of a metal substrate. In FIGS. 4A, 4B, the transducer assemblies have substrate 201 on top or inverted relative to FIGS. 2–3 where substrate 201 is shown on the bottom. In FIG. 4A, the masking layer 202 has been removed and at least a portion of a transducer 240 is formed on substrate 201 using MF manufacturing methods. The transducer 240 covers and seals the exposed bump backs 232, providing an effective sealing or diffusion barrier for subsequent MF vacuum processes used on the transducer assembly 238. With the contact bumps 216 effectively sealed by transducer 240 and sealing layer 220, one or more MF vacuum processes can be performed on transducer 240 to complete transducer 240 without danger of chemical contamination or poisoning from the tin or copper in the layers 230 of contact bumps 216.

As illustrated at FIG. 4B, a portion 244 of metal substrate 201 is etched away to expose the contact bumps 216 for external electrical connection. The contact bumps include a sealing layer 220 that can also serve as an etch stop layer so that contact bumps 216 are not etched when portion 244 is of substrate 201 is etched away.

Figure 5:
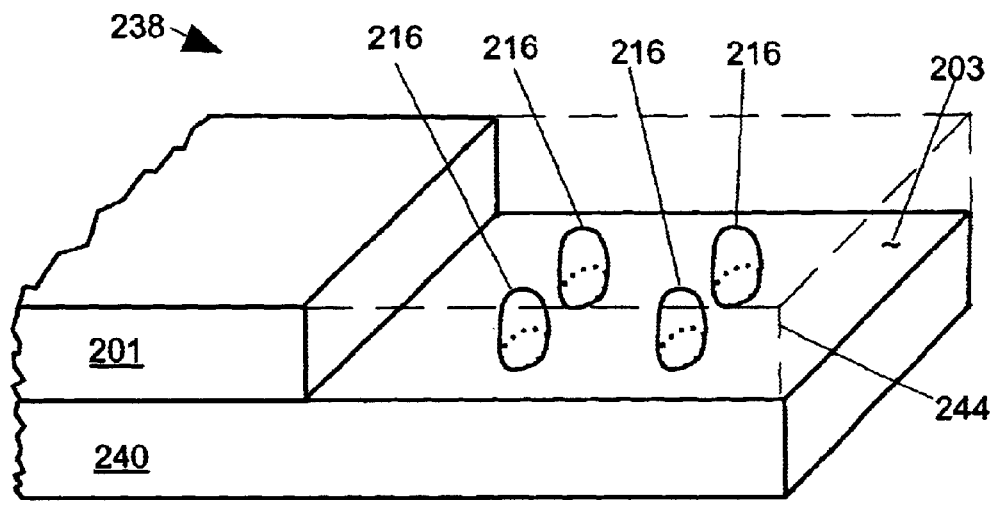
FIG. 5 illustrates a perspective view of an embodiment of a transducer assembly.

FIG. 5 illustrates a perspective view of transducer assembly 238 including a metal substrate 201, of which a portion 244 has been sacrificial by etching to expose electrical contact bumps 216. The electrical contact bumps 216 have bump backs that are sealed in the transducer 240 formed on the substrate 201. The bump fronts are sealed with sealing layer 220. The transducer assembly 238 can be subjected to one or more MF vacuum processes without danger of tin or copper inside the contact bumps 216 diffusing out and causing contamination during MF vacuum manufacturing processes.

Figure 6:
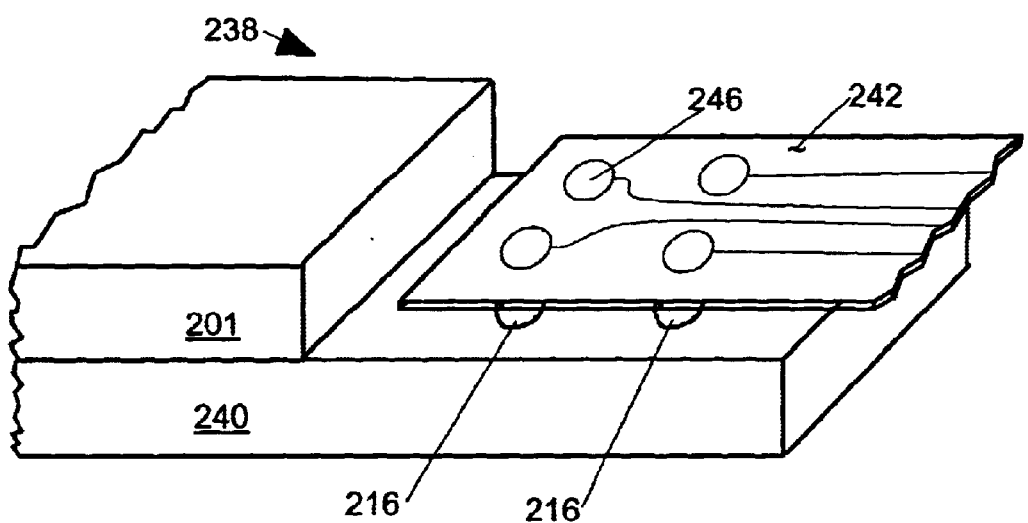
FIG. 6 illustrates a perspective view of a transducer assembly connected to a flexible printed circuit.

FIG. 6 illustrates a perspective view of the completed transducer assembly 238 of FIG. 5 connected to a flexible printed circuit 242. Electrical contacts pads 246 on flexible printed circuit 242 are affixed to contact bumps 216 by reflow soldering, ultrasonic bonding or conductive adhesive, depending on the needs of the application.

The contact bumps are sealed on the back side by the substrate and sealed on the front side by a plated sealing layer. The sealing allows microstructure fabrication processes to be performed on the transducer assembly without danger of contamination from contaminating metals in the contact bump such as tin or solder during vacuum MF processes. The contact bumps can be formed early in the MF manufacturing process for the transducer assembly. There is no need to move the transducer assembly to a different manufacturing environment to add the contact bumps later.

In summary, a method of manufacturing a transducer assembly (238) is disclosed in which an electric current is passed through plating solution (210) in recesses (208) of a metal substrate (201). Contact bumps (216) are plated in the recesses (208) and have bump fronts (218) in the recesses (208) and exposed bump backs (232). A sealing layer (220) is deposited on the bump fronts (218). A transducer (240) is partially formed on the metal substrate (201), and the partially formed transducer (240) seals the exposed bump backs (232). At least one MF vacuum process is performed to complete formation of the transducer (240). A portion (244) of the metal substrate (201) is sacrificed, lost or etched away to expose the electrical contact bumps (216).

The finished transducer assembly (238) comprises a substrate (201) formed of metal. Contact bumps (216) are formed by electroplating in recesses (208) in a sacrificial portion (244) of the metal substrate (201). The contact bumps have bump fronts (218) in the recesses and exposed bump backs (232). A transducer (240) is formed on the metal substrate (201) and the transducer (240) seals the exposed bump backs (232).

In a preferred embodiment, the transducer assembly (238) is included in a read/write head assembly (112) of a disc drive (100) that also includes a disc pack (126).

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example the overall shape and appearance of the metal substrate and transducer can vary considerably from those illustrated without departing from the scope and spirit of the present invention.

What is claimed is:

1. A partially completed transducer assembly, comprising:
   a substrate formed of metal and including a sacrificial portion;
   electroplated contact bumps in recesses in the sacrificial portion of the substrate, the contact bumps having bump fronts in the recesses and exposed bump backs, the contact bumps including a sealing layer on the bump fronts; and
   a transducer formed on the substrate, the transducer sealing the exposed bump backs.

2. The partially completed transducer assembly of claim 1 wherein the electroplated contact bumps have bump fronts that are shaped for contacting an electrically conductive adhesive.

3. The partially completed transducer assembly of claim 1 wherein the electroplated contact bumps have bump fronts that are shaped for soldering.

4. The partially completed transducer assembly of claim 1 wherein the electroplated contact bumps comprise at least tin.

5. The partially completed transducer assembly of claim 1 wherein the sealing layer comprises gold.

6. The partially completed transducer assembly of claim 5 wherein the substrate comprises a cobalt iron alloy.

7. The partially completed transducer assembly of claim 1 wherein the sealing layer is also an etch stop layer.

8. The partially completed transducer assembly of claim 1 wherein the sealing layer comprises gold, and the contact bump includes a copper layer and a layer of nickel between the sealing layer and the copper layer.

9. A partially completed transducer assembly, comprising:
   a substrate formed of metal and including a sacrificial portion;
   recesses in the sacrificial portion of the substrate;
   electroplated contact bumps on the substrate, the contact bumps having bump fronts in the recesses and exposed bump backs;
   means for sealing the bump fronts; and
   a transducer formed on the substrate, the transducer sealing the exposed bump backs.

10. A partially completed transducer assembly, comprising:
    a substrate formed of metal and including a sacrificial portion;
    a transducer having a plurality of contact bumps, the contact bumps having bump backs that are in the transducer and bump fronts that extend into recesses in the sacrificial portion;
    a sealing layer on the exposed bump fronts; and
    the bump fronts having protruding shape adapted for affixing to contact pads of a flexible printed circuit.

11. The partially completed transducer assembly of claim 10 wherein the bump fronts are shaped for contacting an electrically conductive adhesive on the contact pads.

12. The partially completed transducer assembly of claim 10 wherein the bump fronts are shaped for soldering to the contact pads.

13. The partially completed transducer assembly of claim 10 wherein the sealing layer comprises gold electroplate.

14. The partially completed transducer assembly of claim 10 wherein the transducer comprises a read/write transducer in a disc drive.

15. The partially completed transducer assembly of claim 10 wherein the transducer comprises a microactuator mounted on a read/write head assembly.

16. The partially completed transducer assembly of claim 10 wherein the transducer comprises an accelerometer mounted on a read/write head assembly.

* * * * *

UNITED STATES PATENT AND TRADEMARK OFFICE
CERTIFICATE OF CORRECTION

PATENT NO. : 6,643,099 B1  Page 1 of 1
DATED : November 4, 2003
INVENTOR(S) : Wayne A. Bonin et al.

It is certified that error appears in the above-identified patent and that said Letters Patent is hereby corrected as shown below:

<u>Title page</u>,
Item [56], References Cited, FOREIGN PATENT DOCUMENTS, add
-- JP   5-314448   *   11/1993 --

Signed and Sealed this

Eighteenth Day of May, 2004

JON W. DUDAS
*Acting Director of the United States Patent and Trademark Office*